(12) United States Patent
Ohta et al.

(10) Patent No.: US 7,495,329 B2
(45) Date of Patent: Feb. 24, 2009

(54) SEMICONDUCTOR MEMORY CARD

(75) Inventors: Yohichi Ohta, Tokyo (JP); Isao Ozawa, Chigasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 109 days.

(21) Appl. No.: 11/625,578

(22) Filed: Jan. 22, 2007

(65) Prior Publication Data

US 2007/0170567 A1  Jul. 26, 2007

(30) Foreign Application Priority Data

Jan. 24, 2006 (JP) .............................. 2006-014616

(51) Int. Cl.
*H01L 23/48* (2006.01)
(52) U.S. Cl. .................. 257/692; 257/676; 257/679; 257/691; 257/693
(58) Field of Classification Search ................. 257/679, 257/676, 691, 692, 693
See application file for complete search history.

(56) References Cited

U.S. PATENT DOCUMENTS 4,910,582 A  3/1990  Miyamoto et al.

6,433,285 B2  8/2002  Maeda et al.
6,686,663 B2  2/2004  Masuda et al.
6,995,320 B2  2/2006  Kusakabe et al.

FOREIGN PATENT DOCUMENTS

JP  2003-346109  12/2003

OTHER PUBLICATIONS

U.S. Appl. No. 11/625,578, filed Jan. 22, 2007, Ohta et al.

*Primary Examiner*—Douglas M Menz
(74) *Attorney, Agent, or Firm*—Oblon, Spivak, McClelland, Maier & Neustadt, P.C.

(57) ABSTRACT

A semiconductor memory card includes a nonvolatile memory chip mounted on an upper surface of a circuit board. The memory chip has first bonding pads formed close to a first side of the memory chip that are wire-bonded to first board terminals formed on the board along the first side. A controller chip mounted on the memory chip has second bonding pads wire-bonded to second board terminals formed on the board along a second side of the memory chip, adjacent to the first side. A power terminal or a ground terminal has a connection and an extension extended from the connection. The connection and the extension are along the first board terminals and the second board terminals. The connection and the extension are on a lower surface of the board and connect to the first board terminals or the second board terminals via through hole interconnections and the board wiring.

12 Claims, 4 Drawing Sheets

SEMICONDUCTOR MEMORY CARD

CROSS-REFERENCE TO RELATED APPLICATIONS

This application is based upon and claims the benefit of priority from the prior Japanese Patent Application No. 2006-014616, filed on Jan. 24, 2006, the entire contents of which are incorporated herein by reference.

BACKGROUND OF THE INVENTION

1. Field of the Invention

The present invention relates to a semiconductor memory card having a power supply card terminal for supplying electric power and a ground card terminal connected to the ground potential.

2. Background Art

In recent years, miniaturization and weight reduction of a mobile telephone and a personal computer which are provided with a nonvolatile memory chip have been advanced. Further, there is an increasing demand for a memory having a larger capacity and a product having a wide variety of functions.

Semiconductor memory cards such as an xD-Picture™ card are mainly used as storage media of a digital still camera. In the semiconductor chip configuration of the semiconductor memory card, a flash memory which is a nonvolatile memory used as a storage device and a controller chip which has a compatibility function to ensure compatibility with various devices are needed.

Further, in recent years, the capacity of the semiconductor memory card has been increased in accordance with the improvement in pixel resolution of the digital still camera and the extension of moving picture capturing time. The capacity of a semiconductor memory chip used as a storage medium is increased by reducing the size of memory cells. However, further miniaturization of the memory cell has become difficult, and further reduction in the chip size has also become difficult.

On the other hand, the package outer shape dimension of a semiconductor memory card is determined by a standard. When a chip having a size sufficiently smaller than the outer shape dimension of the semiconductor memory card is mounted, a sufficient space can be secured on a card board, so that a high degree of freedom of board wiring is obtained to facilitate the design of wiring. However, when a large capacity chip is mounted, the wiring space is reduced to cause the degree of freedom in the design of board wiring to be restricted.

In order to increase the capacity of a memory and provide a wide variety of functions for the memory, many semiconductor chips need to be mounted. However, with the advancement of miniaturization of products, the size of a circuit board mounted with the semiconductor chips is also reduced to thereby make it difficult to stack and mount many semiconductor chips.

Among conventional semiconductor memory cards, there is for example a memory card provided with: a semiconductor package which includes a base card having an opening part formed in the upper part thereof and a semiconductor memory for storing desired data, on the upper surface of which input/output card terminals electrically connected to the semiconductor memory and an external device to input/output signals, a power supply card terminal, and a ground card terminal are formed in a manner that the input/output card terminals, the power supply card terminal, and the ground card terminal are placed in the base card so as to be exposed via the opening part; and a label which is adhered to the upper part of the base card and covers the semiconductor package so as to allow at least a part of the input/output card terminals to be exposed (for example, see Japanese Patent Laid-Open No. 2003-346109).

Here, in the above described prior art, the input/output card terminals, the power supply card terminal, and the ground card terminal, each of which has a plate-like shape, are merely arranged side by side on the basis of a standard required for example, an xD-Picture™ card, regardless of the length of board wiring and the position of board terminals of the circuit board of the semiconductor package.

Therefore, for example, when the board terminals are arranged to be separated from the power supply card terminal or the ground card terminal, a problem may arise that the wiring length from the board terminals to a through-hole interconnection of the power supply card terminal or the ground card terminal becomes long to thereby hinder the improvement in responsiveness and the reduction in power consumption of the semiconductor memory card. Further, there is a problem that crosstalk between the board wiring may be generated due to the complication of board wiring structure and the like.

SUMMARY OF THE INVENTION

According one aspect of the present invention, there is provided: a semiconductor memory card which inputs/outputs signals by connecting to an external device, comprising a circuit board on an upper surface of which board terminals connected to board wiring are formed, and on a lower surface of which input/output card terminals for inputting/outputting signals to/from the external device, a power supply card terminal for supplying electric power, and a ground card terminal connected to ground potential by connecting to the external device are provided; a nonvolatile memory chip which is mounted on the upper surface of the circuit board, and has a plurality of first bonding pads formed close to a first side of the nonvolatile memory chip in a manner that the plurality of first bonding pads are wire-bonded to a plurality of first board terminals formed on the circuit board along the first side; and a controller chip which is mounted on the nonvolatile memory chip, and has a plurality of second bonding pads formed in a manner that the plurality of second bonding pads are wire-bonded to a plurality of second board terminals formed on the circuit board along a second side of the nonvolatile memory chip, adjacent to the first side, and which controls the nonvolatile memory chip, wherein the power supply card terminal or the ground card terminal has a connection can be connected to the external device and an extension extended from the connection in a manner that the connection and the extension are along the first board terminals and the second board terminals via the circuit board.

DETAILED DESCRIPTION

In the following, embodiment to which the present invention is applied will be described with reference to the accompanying drawings It should be noted that, for the sake of simplicity, a case where one nonvolatile memory chip and one controller chip are stacked is explained as an example.

Embodiment 1

Figure 1:
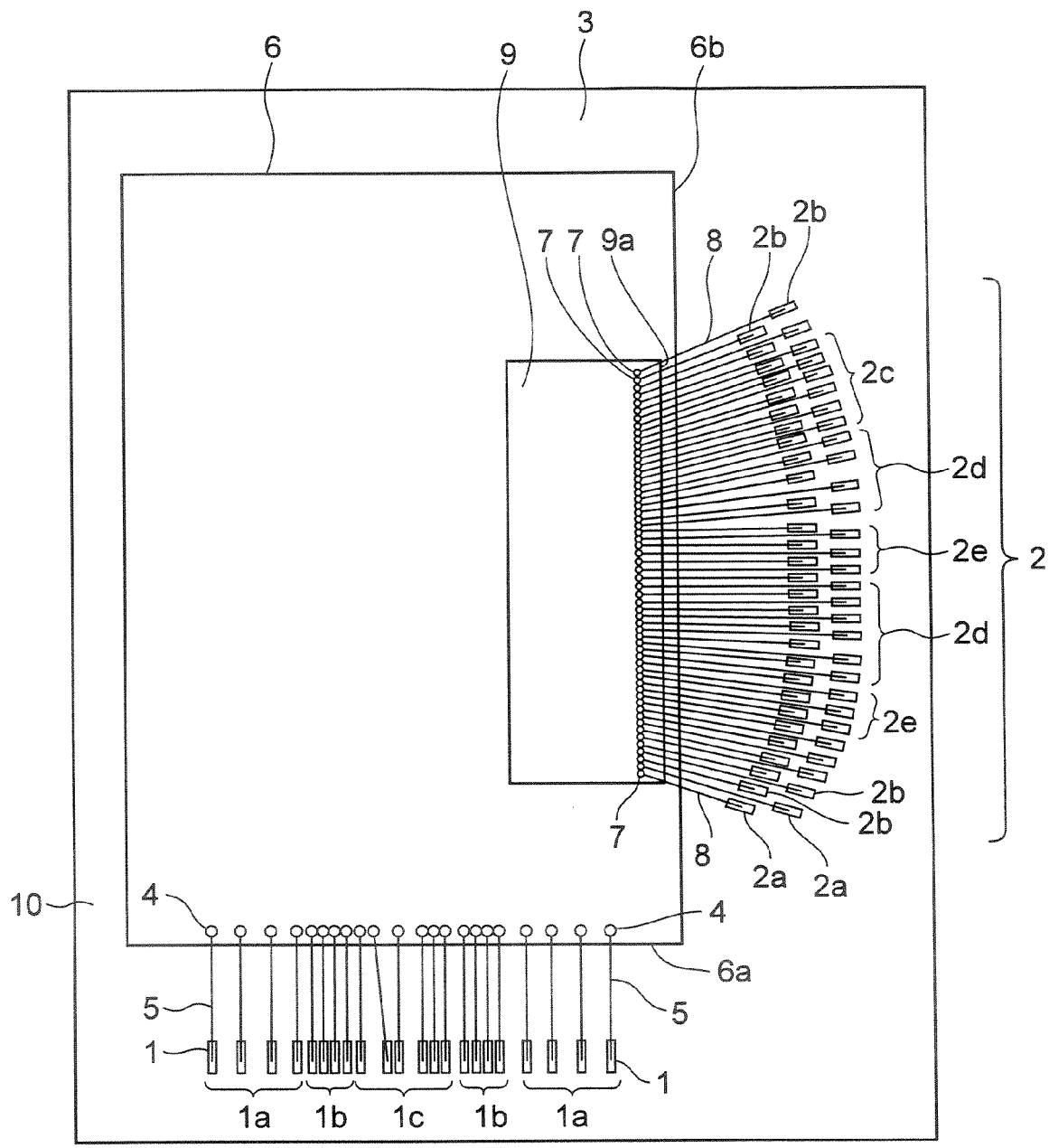
FIG. 1 is a top view showing a configuration of a main part of a semiconductor memory card according to Embodiment 1 of the present invention.

FIG. 1 is a top view showing a configuration of a main part of a semiconductor memory card according to Embodiment 1 of the present invention. It should be noted that, in FIG. 1, a sealing resin for sealing a nonvolatile memory chip, a controller chip and the like on a circuit board is omitted for the purposes of explanation.

As shown in FIG. 1, the semiconductor memory card 100 which inputs and outputs signals by connecting to an external device (not shown), includes: an approximately rectangular circuit board 3 on the upper surface of which a first and second board terminals 1 and 2 connected to board wiring are formed; an substantially rectangular nonvolatile memory chip 6 which is mounted on the upper surface of the circuit board 3, and has a plurality of first bonding pads 4 formed close to a first side 6a of the nonvolatile memory chip 6 in a manner that the plurality of first bonding pads 4 are wire-bonded by bonding wires 5 to the plurality of first board terminals 1 formed along the first side 6a on the circuit board 3; and an approximately rectangular controller chip 9 which is mounted on the nonvolatile memory chip 6, and has a plurality of second bonding pads 7 formed in a manner that the plurality of second bonding pads 7 are wire-bonded by bonding wires 8 to the plurality of second board terminals 2 formed along a second side 6b of the nonvolatile memory chip 6 adjacent to the first side 6a, and which controls the nonvolatile memory chip 6.

The first board terminals 1 include: nonvolatile memory input/output board terminals 1a for inputting/outputting data input/output signals which include an address, a command, and input/output data, to/from the nonvolatile memory chip 6; nonvolatile memory control board terminals 1b for inputting control signals which control the nonvolatile memory chip 6, into the nonvolatile memory chip 6 from the controller chip 9; and power supply board terminals 1c for supplying electric power to the nonvolatile memory chip 6 from the outside.

For example, in the case where the nonvolatile memory chip 6 is an NAND type flash memory, the control signals for controlling the nonvolatile memory chip 6 include: a "WP" (Write Protect) signal for forcibly inhibiting the writing and erasing operations; a "WE" (Write Enable) signal for writing data; an "ALE" (Address Latch Enable) signal for controlling the input of an address and data; a "CLE" (Command Latch Enable) signal for controlling the input of a command; a "CE" (Chip Enable) signal for bringing the chip into an operating state; an "RE" (Read Enable) signal for enabling data to be outputted; and an "RB" (Ready Busy) signal for informing the outside of the operating state.

Further, the second bonding pads 7 are formed along one long side 9a of the controller chip 9. It should be noted that whenever possible, the second bonding pads 7 may be further formed along the side opposite to the long side 9a so that the wiring can be provided on the both sides of the nonvolatile memory chip 6.

The second board terminals 2 include: power supply board terminals 2a for supplying electric power to the controller chip 9 from the outside; ground board terminals 2b connected to the ground potential by connecting to the external device; first memory interface board terminals 2c connected to the nonvolatile memory control board terminals 1b on the circuit board 3; host interface board terminals 2d connected to external terminals, for inputting/outputting data input/output signals and control signals; and second memory interface board terminals 2e wired to the nonvolatile memory input/output board terminals 1a on the circuit board 1.

The second board terminals 2 are arranged side by side in an approximately fan shape along the second side 6b on the circuit board 3. This enables the respective wiring distances from the second board terminals 2 to the second bonding pads 7 to be more equalized.

Further, the second board terminals 2 are alternately zigzag arranged in two rows along the second side 6b on the circuit board 3 so as to prevent contact between the connected bonding wires 8. Thereby, as compared with the case where the second board terminals 2 are arranged in one row, it is possible to arrange the second board terminals 2 in a region closer to the long side 9a of the controller chip 9, while securing an area required for arranging the second board terminals 2.

Here, for example, in the case of read operation, the data input/output signals outputted from the controller chip 9 include the address and the command, as described above. On the basis of the data input/output signals, a physical address block of the nonvolatile memory chip 6 is specified so that the address block is set to a read-out enable state. Then, on the basis of the control signals outputted from the controller chip 9, the nonvolatile memory chip 6 outputs predetermined data from the specified address block from the nonvolatile memory input/output board terminals 1a.

When controlling a series of such read operations, the data input/output signals need to be inputted into the nonvolatile memory chip 6 prior to the control signals. In addition, there is a similar need when other operations such as the write operation are controlled.

Thus, the second memory interface board terminals 2e are arranged closer to the first side 6a of the nonvolatile memory chip 6 than the first memory interface board terminals 2c. This makes it possible to shorten the wiring length between the nonvolatile memory input/output board terminals 1a and the second memory interface board terminals 2e, to thereby reduce the signal delay of the data input/output signals.

A solder resist 10 is film-formed on the upper surface of the circuit board 3 except for the bonding and wiring regions of the first board terminals 1, the second board terminals 2, and the like, so that the board wiring and the like formed on the circuit board 3 are insulated.

For example, a gold wire is selected for use as the bonding wires 5 and 8. At the time of wire-bonding the bonding wires 5 and 8, supersonic vibrations are applied to each of the first and second bonding pads 4 and 7.

Next, a wiring structure of the above described circuit board 3 is explained.

Figure 2:
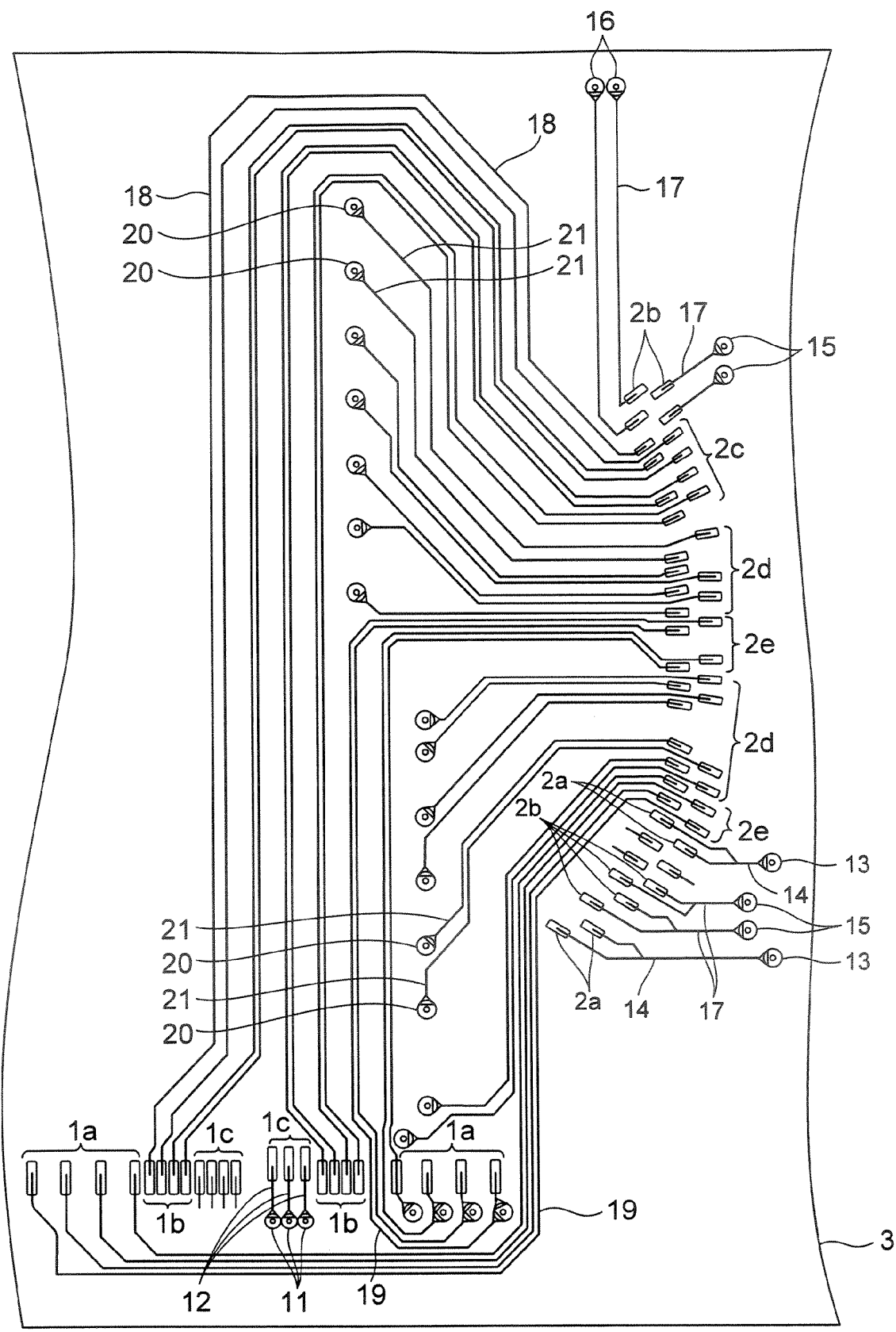
FIG. 2 is a top view showing a configuration of a main part of board wiring of the circuit board of the semiconductor memory card according to Embodiment 1 of the present invention.

FIG. 2 is a top view showing a configuration of a main part of board wiring of the circuit board of the semiconductor memory card according to Embodiment 1 of the present invention. Here, a case where the board wiring has one layer is explained. It should be noted that in FIG. 2, the solder resist, and the board wiring, through hole interconnection or the like which are not related to the configuration of the present invention, are omitted for the purposes of explanation.

As shown in FIG. 2, the power supply board terminals 1c and through hole interconnection 11 is connected by board wiring 12. The power supply board terminals 2a and through hole interconnection 13 is connected by board wiring 14. Further, the ground board terminals 2b and through hole interconnection 15 and 16 is connected by board wiring 17.

Further, the first memory interface board terminals 2c are connected to the nonvolatile memory control board terminals 1b by board wiring 18, while the second memory interface board terminals 2e are connected to the nonvolatile memory input/output board terminals 1a by board wiring 19. Further, the host interface board terminals 2d are connected to through hole interconnection 20 by board wiring 21.

As described above, the second memory interface board terminals 2e are arranged closer to the first side 6a of the nonvolatile memory chip 6 than the first memory interface board terminals 2c, so that the wiring length of the board wiring 19 can be made shorter than the wiring length of the board wiring 18.

It should be noted that the second memory interface board terminals 2e are preferably arranged as close as possible to the first side 6a, but here, the arrangement of the through holes 20 is restricted by a standard for the semiconductor memory card, and hence, the host interface board terminals 2d are arranged between the second memory interface board terminals 2e in consideration of the wiring. The signals which are inputted/outputted through the host interface board terminals 2d are inputted/outputted to/from the back side of the circuit board 1 via the through holes 20.

Next, the configuration of card terminals arranged from the host interface board terminals to the back side of the circuit board, and the signals inputted/outputted to/from the card terminals are explained.

Figure 3:
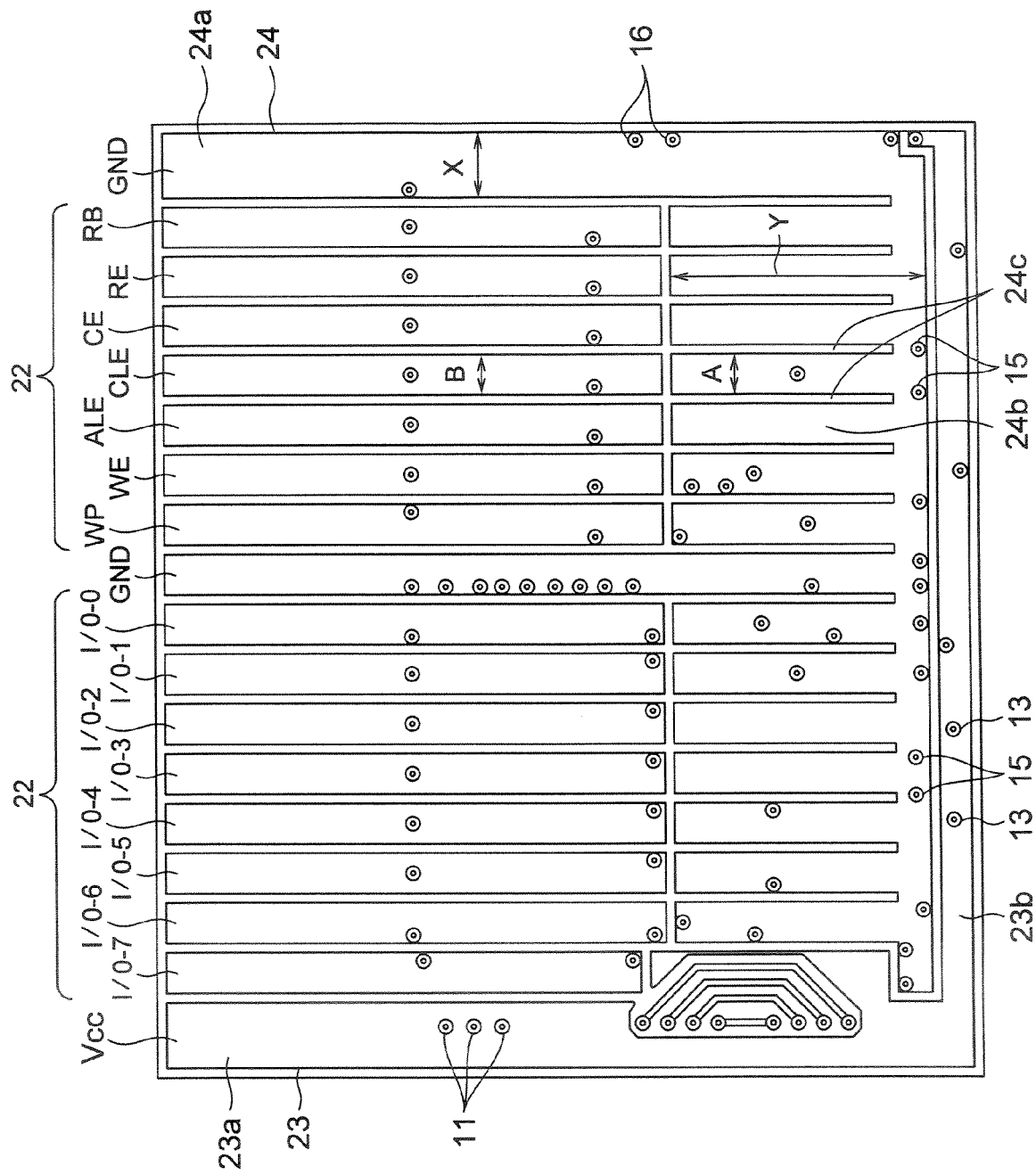
FIG. 3 is a top view showing an outline of the card terminals formed on the back side of the circuit board of the semiconductor memory card according to Embodiment 1 of the present invention.

FIG. 3 is a top view showing an outline of the card terminals formed on the back side of the circuit board of the semiconductor memory card according to Embodiment 1 of the present invention. Here, a case where an NAND type flash memory is used as the nonvolatile memory is explained.

As shown in FIG. 3, on the back side (lower surface) of the circuit board 3, there are provided input/output card terminals 22 for inputting/outputting signals to/from the external device, a power supply card terminal 23 for supplying electric power, and a ground card terminal 24 connected to the ground potential by connecting to the external device.

The power supply card terminal 23 has a connection 23a which is formed along the first board terminals 1 via the circuit board 3 shown in FIG. 2 and can be connected to the external device, and an extension 23b which is formed along the second board terminals 2 via the circuit board 3 and extended from the connection 23a. Thus, the power supply card terminal 23 is formed into an approximately L shape. It should be noted that in accordance with the standard of the semiconductor memory card, the wiring structure of the circuit board and the like, the power supply card terminal 23 may be formed into an approximately L shape in such a manner that the connection 23a is formed along the second board terminals 2 via the circuit board 3, and the extension 23b is formed along the first board terminals 1 via the circuit board 3.

The ground card terminal 24 is also formed into an approximately L shape, and has a connection 24a can be connected to the external device and an extension 24b extended from the connection 24a so as to be formed along the second board terminals 2 via the circuit board 3.

The ground card terminal 24 is also formed so as to make the width "Y" of the extension 24b larger than the width "X" of the connection 24a can be connected to the external device.

Thereby, a microstrip structure is obtained in which the ground card terminals 22 as a ground wiring layer are arranged only on one surface of the circuit board 3 as a signal wiring layer on which the board wiring is formed. The ground card terminal 22 in the microstrip structure provides stable characteristic impedance values, and has an important function to reduce noise (reduce crosstalk between board wiring).

A plurality of slits 24c are formed so that the extension 24b of the ground card terminal 24 has a comb-like shape. Here, for example, the slits 24c are formed so as to correspond to the intervals between the respective input/output terminals 22 arranged in accordance with the standard of the semiconductor memory card. In this way, the distance "A" between adjacent slits 24c of the extension 24b is the same as the width "B" of the input/output card terminals 22.

This makes it possible to reduce the stress potentially generated in the extension 24b of the ground card terminal 24, the area of which can be made larger than the area of the other terminals, for example, by heating at the time of wire-bonding processing. That is, this makes it possible to reduce the stress potentially generated by heating, and to improve the bonding property and the adhesion property between the circuit board and the nonvolatile memory chip, while realizing the above described microstrip structure by making the width of the extension 24b large.

Further, the width of the extension 24b of the ground card terminal 24 is made larger than the width of the connection 24a, thereby enabling the wiring resistance to be reduced.

Further, as described above, the through hole interconnection 11, 13, 15 and 16 for connecting the power supply card terminal 23 and the ground card terminal 24 to the first and second board terminals 1 and 2 are formed in the circuit board 3 Thus, the power supply board terminals 1c of the first board terminals 1 are connected to the connection 23a of the power supply card terminal 23 via the board wiring 12 and the adjacent through hole interconnection 11. Further, the power supply board terminals 2a of the second board terminals 2 are connected to the extension 23b of the power supply card terminal 23 via the board wiring 14 and the adjacent through hole interconnection 13.

Moreover, the ground board terminals 2b of the second board terminals 2 are connected to the connection 24a of the ground card terminal 24 via the board wiring 17 and the adjacent through hole interconnection 16. Further, the ground board terminals 2b of the second board terminals 2 are connected to the extension 24b of the ground card terminal 24 via the board wiring 17 and the adjacent through hole interconnection 15.

In this way, the respective board terminals 1 and 2 are connected to the power supply card terminal 23 and the ground card terminal 24 in a shorter distance, thereby enabling the loss in the board wiring 12, 14, 16 and 17 to be reduced.

It should be noted that the connection and the extension of the ground card terminal may also be provided in such a manner that the ground card terminal is formed along the first board terminals and the second board terminals, in accordance with the standard of the semiconductor memory card, the wiring structure of the circuit board and the like.

Here, as shown in FIG. 3, for example, VCC, VSS, I/O-0 to I/O-7, "RB" (Ready/Busy), "RE" (Read Enable), "CE" (Chip Enable), "CLE" (Command Latch Enable), "ALE" (Address Latch Enable), "WE" (Write Enable), and "WP" (Write Protect) are assigned to the respective card terminals.

The power supply card terminal 23 to which VCC is assigned is a VCC input card terminal for supplying the power supply potential (VCC). The ground card terminal 24 to which VSS is assigned is a VSS input card terminal for supplying the ground potential (VSS).

Further, the input/output card terminals 22 to which I/O-0 to I/O-7 are assigned are card terminals for inputting/outputting an address, a command, and input/output data.

Further, the input/output card terminal 22 to which "RB" is assigned is an output card terminal for informing the outside of the operating state in the semiconductor memory card. The input/output card terminal 22 to which "RE" is assigned is an output card terminal for serially outputting data. The input/output card terminal 22 to which "CE" is assigned is an input card terminal for receiving a device selection signal.

Further, the input/output card terminal 22 to which "CLE" is assigned is a card terminal into which a signal for controlling the input of an operation command to a command register (not shown) in the semiconductor memory card is inputted. The input/output card terminal 22 to which "ALE" is assigned is a card terminal into which a signal for controlling the input of address data and input data into an address register and a data register (both not shown) in the semiconductor memory card is inputted.

Further, the input/output card terminal 22 to which "WE" is assigned is a card terminal into which a signal for inputting each data from the I/O input/output card terminals into the semiconductor memory card is inputted. The input/output card terminal 22 to which WP is assigned is a card terminal into which a signal for forcibly inhibiting writing/erasing operations is inputted.

It should be noted that the signals inputted/outputted to/from the input/output card terminals 22 of I/O-0 to I/O-7 correspond to the above described data input/output signals. Further, signals respectively inputted to card terminals of "RB", "RE", "CE", "CLE", "ALE", "WE" and "WP" are processed by the controller chip, and the above described control signals are generated on the basis of the processing result.

Figure 4:
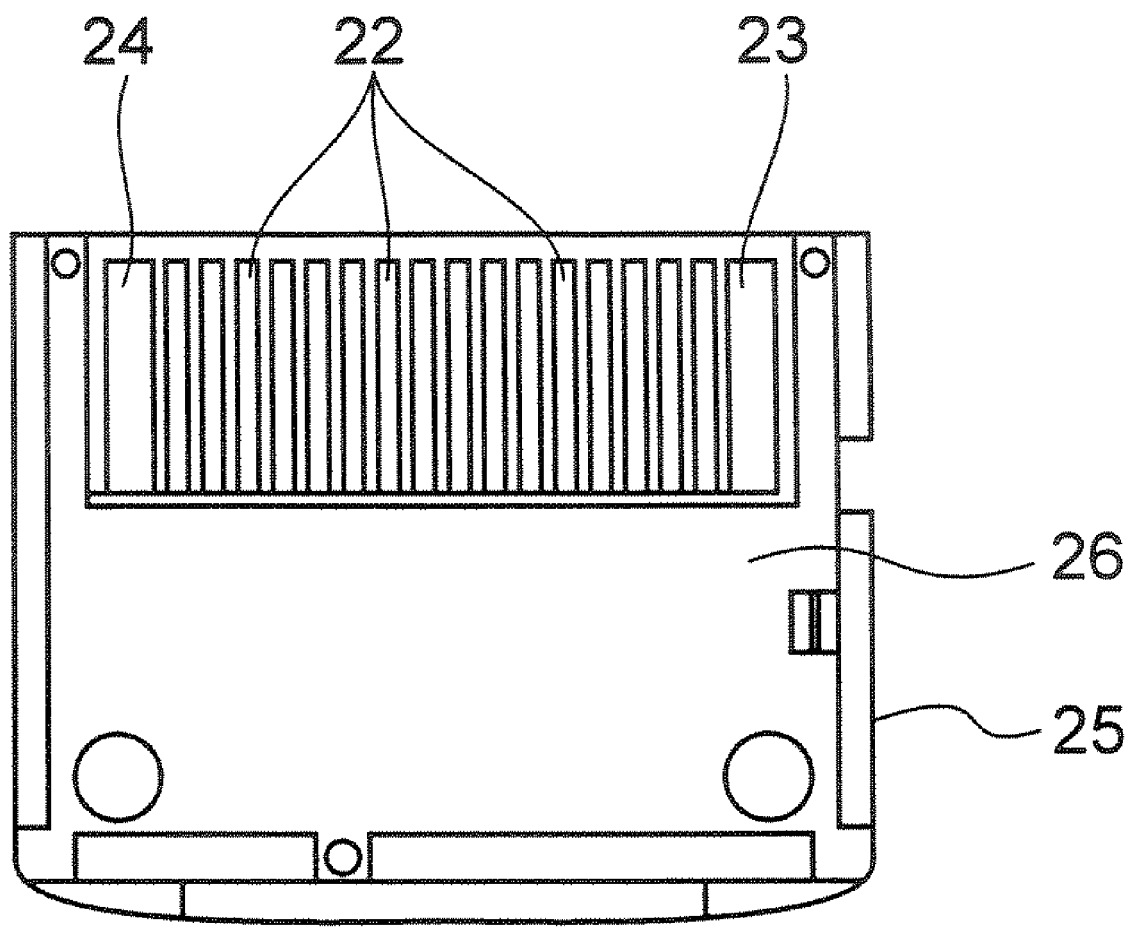
FIG. 4 is a figure showing an appearance of the semiconductor memory card according to Embodiment 1 of the present invention.

Next, an external appearance of the semiconductor memory card 100 having the above described internal configuration is explained. FIG. 4 is a figure showing an appearance (lower surface side) of the semiconductor memory card according to Embodiment 1 of the present invention.

As shown in FIG. 4, the semiconductor memory card 100 is completed by incorporating a circuit board connected to the input/output card terminals 22, the power supply card terminal 23, and the ground card terminal 24 in a cover case 25, and by attaching an insulating sheet 26 and the like to a predetermined position As described above, the input/output card terminals 22 inputs/outputs desired signals by connecting to the external terminals of the external device. Further, electric power supplied from the external device is supplied to the nonvolatile memory chip and the controller chip via the power supply card terminal 23, the board wiring of the circuit board and the like. Further, the ground card terminal 24 is grounded by being connected to the external terminals of the external device.

As described above, in the semiconductor memory card according to the present embodiment, it is possible to reduce crosstalk between board wiring, while improving the responsiveness and reducing power consumption.

It should be noted that in the present embodiment, a case where one nonvolatile memory chip is mounted on the circuit board is explained, but the similar operating effect can be obtained even in the case where a plurality of nonvolatile memory chips are stacked.

Further, in the present embodiment, a case where the power supply card terminal and the ground card terminal have an approximately L shape is explained, but the power supply card terminal and the ground card terminal may also have, for example, an approximately T shape in accordance with the standard and wiring of card terminals, or the like.

What is claimed is:

1. A semiconductor memory card which inputs/outputs signals by connecting to an external device, comprising:
   a circuit board on an upper surface of which board terminals connected to board wiring are formed, and on a lower surface of which input/output card terminals for inputting/outputting the signals to/from the external device, a power supply card terminal for supplying electric power, and a ground card terminal connected to ground potential by connecting to the external device are provided;
   a nonvolatile memory chip which is mounted on the upper surface of the circuit board, and has a plurality of first bonding pads formed close to a first side of the nonvolatile memory chip in a manner that the plurality of first bonding pads are wire-bonded to a plurality of first board terminals formed on the circuit board along the first side; and
   a controller chip which is mounted on the nonvolatile memory chip, and has a plurality of second bonding pads formed in a manner that the plurality of second bonding pads are wire-bonded to a plurality of second board terminals formed on the circuit board along a second side of the nonvolatile memory chip, adjacent to the first side, and which controls the nonvolatile memory chip,
   wherein the power supply card terminal or the ground card terminal has a connection which can be connected to the external device and an extension extended from the connection in a manner that the connection and the extension are along the first board terminals and the second board terminals via the circuit board, the connection and the extension being formed on the lower surface of the circuit board, and being connected to the first board terminals or the second board terminals via through hole interconnections and the board wiring.

2. The semiconductor memory card according to claim 1,
   wherein the power supply card terminal has the connection which is formed along the first board terminals via the circuit board and can be connected to the external device, and the extension which is formed along the second board terminals via the circuit board and extended from the connection, and
   wherein the ground card terminal has the connection which can be connected to the external device, and the extension formed along the second board terminals via the circuit board, and the extension is formed to have a width larger than a width of the connection of the ground card terminal.

3. The semiconductor memory card according to claim 2, wherein a plurality of slits are formed in a comb-like shape in the extension of the ground card terminal.

4. The semiconductor memory card according to claim 3, wherein a width between adjacent slits of the extension is the same as a width of the input/output card terminals.

5. The semiconductor memory card according to claim 2, wherein a first through hole interconnection for connecting the connection of the power supply card terminal or the ground card terminal to the first board terminals, and a second through hole interconnection for connecting the extension of the power supply card terminal or the ground card terminal to the second board terminals are formed in the circuit board.

6. The semiconductor memory card according to claim 3, wherein a first through hole interconnection for connecting the connection of the power supply card terminal or the ground card terminal to the first board terminals, and a second through hole interconnection for connecting the extension of the power supply card terminal or the ground card terminal to the second board terminals are formed in the circuit board.

7. The semiconductor memory card according to claim 4, wherein a first through hole interconnection for connecting the connection of the power supply card terminal or the ground card terminal to the first board terminals, and a second through hole interconnection for connecting the extension of the power supply card terminal or the ground card terminal to the second board terminals are formed in the circuit board.

8. The semiconductor memory card according to claim 1, wherein the power supply card terminal or the ground card terminal has an approximately L shape.

9. The semiconductor memory card according to claim 2, wherein the power supply card terminal or the ground card terminal has an approximately L shape.

10. The semiconductor memory card according to claim 3, wherein the power supply card terminal or the ground card terminal has an approximately L shape.

11. The semiconductor memory card according to claim 4, wherein the power supply card terminal or the ground card terminal has an approximately L shape.

12. The semiconductor memory card according to claim 5, wherein the power supply card terminal or the ground card terminal has an approximately L shape.

* * * * *